US008145020B2

(12) United States Patent
Fujimoto

(10) Patent No.: US 8,145,020 B2
(45) Date of Patent: Mar. 27, 2012

(54) SEMICONDUCTOR DEVICE

(75) Inventor: Takafumi Fujimoto, Tokyo (JP)

(73) Assignee: Toshiba Mitsubishi—Electric Industrial Systems Corporation, Tokyo (JP)

( * ) Notice: Subject to any disclaimer, the term of this patent is extended or adjusted under 35 U.S.C. 154(b) by 0 days.

(21) Appl. No.: 12/603,893

(22) Filed: Oct. 22, 2009

(65) Prior Publication Data

US 2010/0040329 A1   Feb. 18, 2010

Related U.S. Application Data

(63) Continuation of application No. PCT/JP2007/060631, filed on May 24, 2007.

(51) Int. Cl.
  *G02B 6/26*  (2006.01)
  *H01L 29/74*  (2006.01)
  *H01L 21/332*  (2006.01)

(52) U.S. Cl. ............. 385/50; 385/15; 385/16; 385/27; 438/133; 438/134; 438/135; 438/136; 438/137; 438/138; 438/139; 438/140; 257/107; 257/113; 257/114; 257/115; 257/116; 257/117; 257/118; 257/157

(58) Field of Classification Search ............ 385/50, 385/27, 15–16; 257/107, 113–118, 157; 438/133–140
See application file for complete search history.

(56) References Cited

U.S. PATENT DOCUMENTS

| 4,167,746 A | * | 9/1979 | Storm | 257/115 |
| 4,207,583 A | * | 6/1980 | Temple | 257/115 |
| 4,368,481 A | | 1/1983 | Ohashi et al. | |
| 4,466,009 A | * | 8/1984 | Konishi et al. | 257/432 |
| 4,500,164 A | * | 2/1985 | Kiyohara | 385/43 |
| 5,596,210 A | * | 1/1997 | Konishi et al. | 257/98 |
| 5,742,716 A | * | 4/1998 | Yamashita et al. | 385/33 |
| 6,995,407 B2 | * | 2/2006 | Taylor et al. | 257/113 |

FOREIGN PATENT DOCUMENTS

| EP | 53 020 B1 | 3/1986 |
| JP | 57-035357 A | 2/1982 |
| JP | 62-50712 | 3/1987 |
| JP | 6-148458 | 5/1994 |
| JP | 9-172161 A | 6/1997 |
| JP | 2000-4576 | 1/2000 |
| JP | 2000-116110 | 4/2000 |
| JP | 2006-119497 | 5/2006 |

OTHER PUBLICATIONS

English translation of International Preliminary Report on Patentability from the International Bureau in International Application No. PCT/JP2007/060631 mailed Jan. 21, 2010.
International Search Report from Japanese Patent Office in International Application No. PCT/JP2007/06031 mailed Aug. 7, 2007.
Office Action issued by the German Patent and Trademark Office on Feb. 17, 2011, in a German application No. 11 2007 003 519.6-33 and English translation thereof (5 pages).

* cited by examiner

*Primary Examiner* — Brian M. Healy
*Assistant Examiner* — Guy Anderson
(74) *Attorney, Agent, or Firm* — Finnegan, Henderson, Farabow, Garrett & Dunner, L.L.P.

(57) ABSTRACT

A semiconductor device includes a direct light-triggered thyristor triggered by an optical gate signal, a first optical fiber connected to the direct light-triggered thyristor and through which the optical gate signal is transmitted, a second optical fiber used to extend the first optical fiber, and a inter-optical-fiber relaying unit configured to connect the first optical fiber to the second optical fiber and to input the optical gate signal output from the second optical fiber to the first optical fiber.

8 Claims, 4 Drawing Sheets

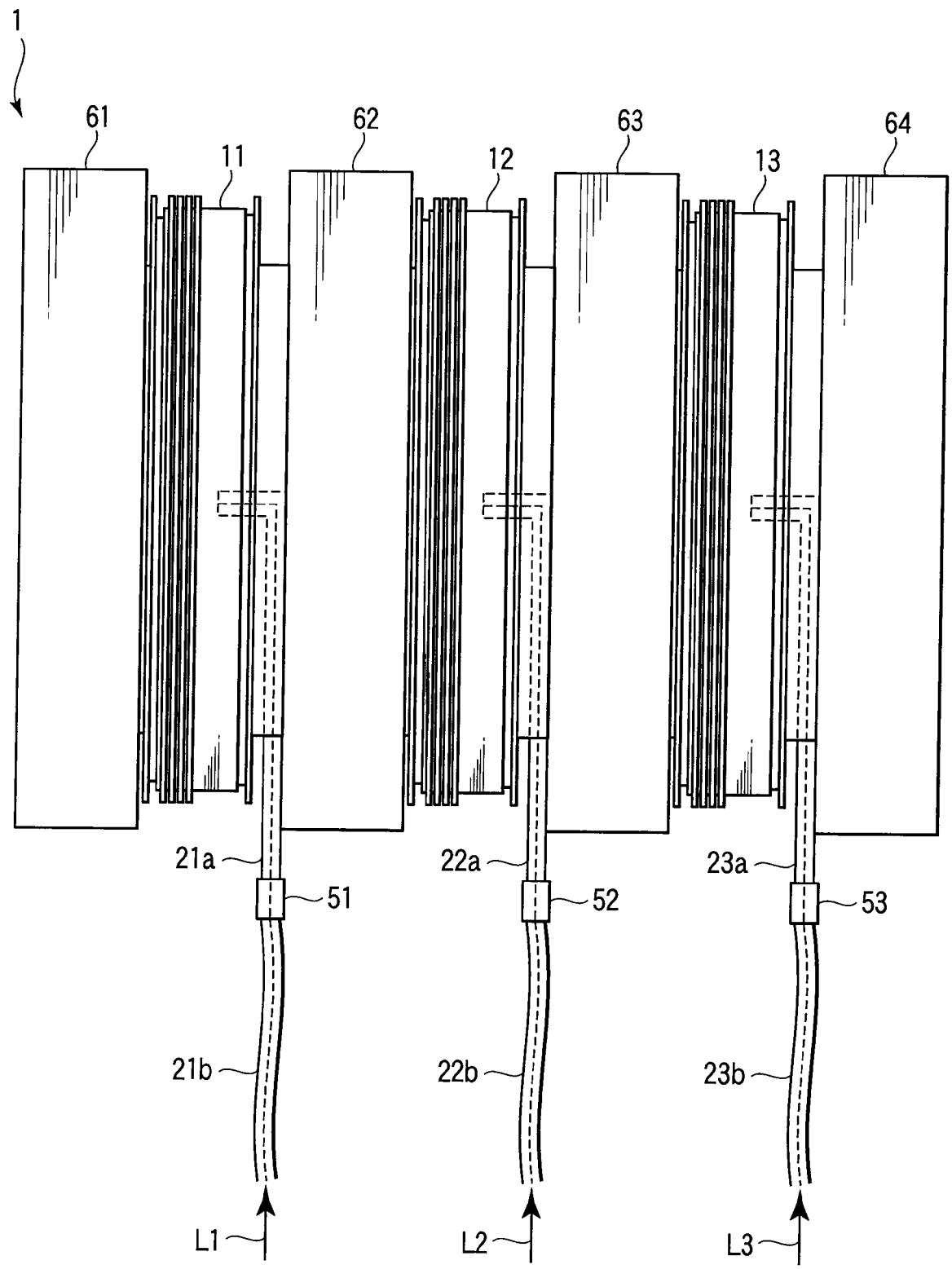
F I G. 2

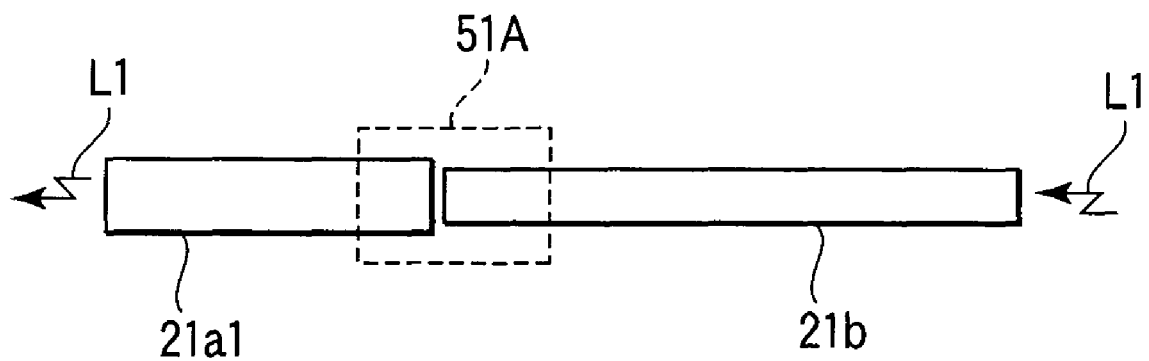
F I G. 5

US 8,145,020 B2

SEMICONDUCTOR DEVICE

CROSS-REFERENCE TO RELATED APPLICATIONS

This is a Continuation Application of PCT Application No. PCT/JP2007/060631, filed May 24, 2007, which was published under PCT Article 21(2) in Japanese.

BACKGROUND OF THE INVENTION

1. Field of the Invention

The present invention relates to a semiconductor device including a direct light-triggered thyristor.

2. Description of the Related Art

In recent years, using a direct light-triggered thyristor to configure a semiconductor device is known. For example, there is a semiconductor device including a structure in which cooling fins and direct light-triggered thyristors are alternately bonded.

However, in the above-described semiconductor device, a connection side of an optical fiber with respect to the direct light-triggered thyristor is often structurally embedded. Therefore, in the semiconductor device, the optical fiber is being pulled out from the direct light-triggered thyristor. The optical fiber must be sufficiently carefully handled because of properties of a material thereof. Therefore, when manufacturing, assembling, or disassembling such a semiconductor device, inconvenience arises from handling due to the pulled-out optical fiber. In particular, a length of the optical fiber is increased as the semiconductor device is installed in a higher-voltage unit. When the length of the optical fiber is increased, handling the semiconductor device becomes more difficult.

Furthermore, when the optical fiber is damaged, the optical fiber must be replaced. However, when one end of the optical fiber is structurally embedded in the semiconductor device, the semiconductor device must be disassembled in order to replace the optical fiber.

As explained above, in the semiconductor device including the direct light-triggered thyristor, inconvenience often arises from handling due to the optical fiber that is connected to the direct light-triggered thyristor.

BRIEF SUMMARY OF THE INVENTION

It is an object of the present invention to provide a semiconductor device including a direct light-triggered thyristor, the device enabling reducing inconvenience which arises from handling due to an optical fiber.

According to one aspect of the present invention, there is provided a semiconductor device, comprising: a direct light-triggered thyristor triggered by an optical gate signal; a first optical fiber connected to the direct light-triggered thyristor and through which the optical gate signal is transmitted; a second optical fiber used to extend the first optical fiber; and a inter-optical-fiber relaying unit configured to connect the first optical fiber to the second optical fiber and to input the optical gate signal output from the second optical fiber to the first optical fiber.

BRIEF DESCRIPTION OF THE SEVERAL VIEWS OF THE DRAWING

FIG. 2 is an appearance diagram showing the configuration of the semiconductor device according to the first embodiment of the present invention;

FIG. 5 is a block diagram showing a connected state of optical fibers of the semiconductor device according to the second embodiment of the present invention.

DETAILED DESCRIPTION OF THE INVENTION

Embodiments according to the present invention will now be described hereinafter in detail with reference to the accompanying drawings.

First Embodiment

Figure 1:
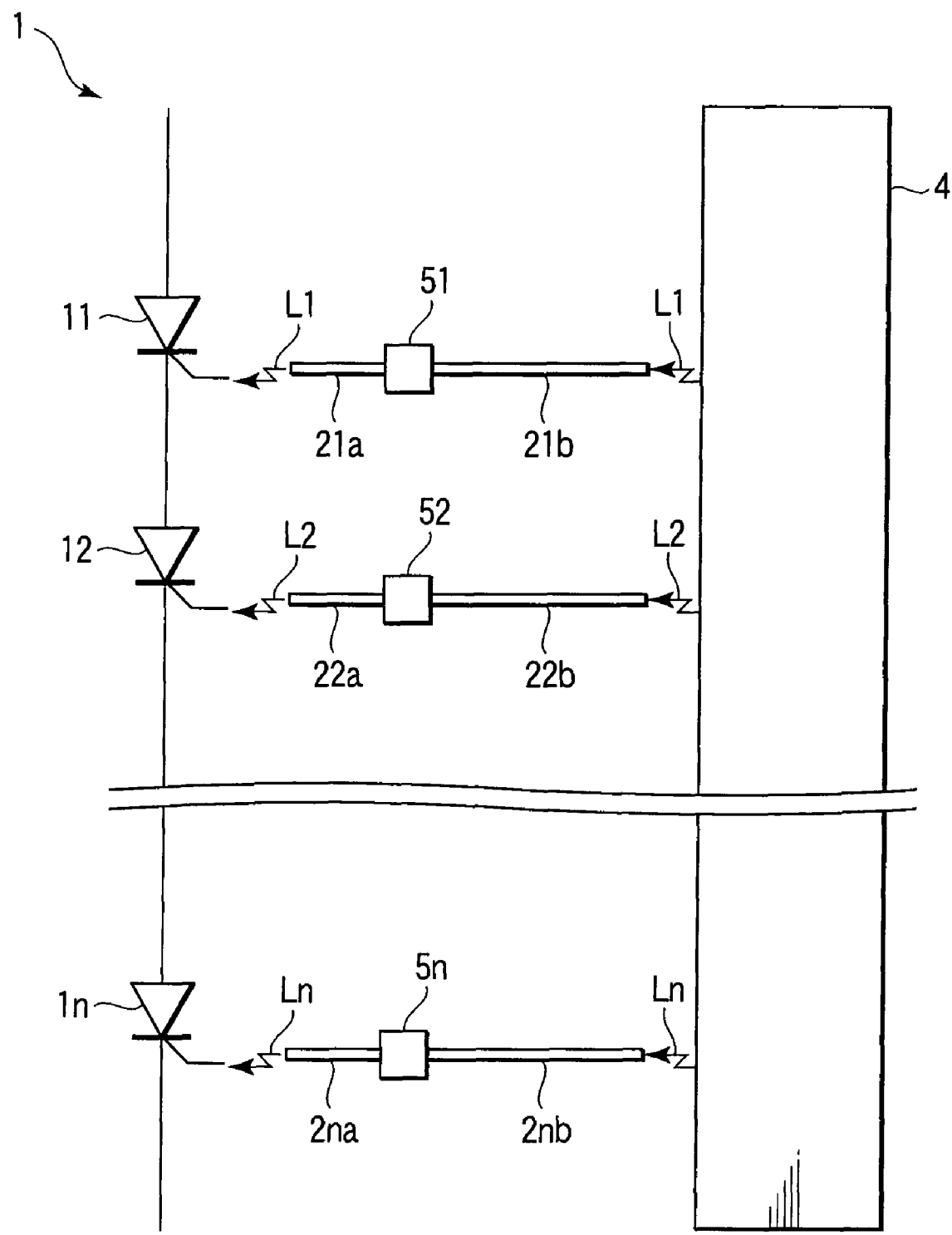
FIG. 1 is a block diagram showing a configuration of a semiconductor device according to a first embodiment of the present invention.

FIG. 1 is a block diagram showing a configuration of a semiconductor device 1 according to a first embodiment of the present invention. FIG. 2 is an appearance drawing showing the configuration of the semiconductor device 1 according to the first embodiment of the present invention. In the drawings, the same reference numerals denote the same parts to omit a detailed explanation thereof, and different parts will be mainly described. In a subsequent embodiment, a tautological explanation will be likewise omitted.

The semiconductor device 1 includes n direct light-triggered thyristors 11 to 1n connected in series, optical fibers 21a to 2na through which optical gate signals L1 to Ln are input to the direct light-triggered thyristors 11 to 1n, respectively, optical fibers 21b to 2nb which are used to extend the optical fibers 21a to 2na, respectively, a gate generator 4 connected to input sides of the optical fibers 21b to 2nb, relay portions 51 to 5n which connect the optical fibers 21b to 2nb to the optical fibers 21a to 2na, respectively, and cooling fins 61 to 6n bonded to the direct light-triggered thyristors 11 to 1n, respectively. Here, n is an integer equal to or above 1, but respective constituent elements are appropriately omitted in the drawings.

A structure is configured by alternately bonding the direct light-triggered thyristors 11 to 1n to the cooling fins 61 to 6n, respectively. In the structure, the optical fibers 21a to 2na are connected to the direct light-triggered thyristors 11 to 1n, respectively. Therefore, connecting portions of the optical fibers 21a to 2na with respect to the direct light-triggered thyristors 11 to 1n are embedded in the structure. One end of each of the optical fibers 21a to 2na is pulled out from the structure to facilitate the connection with each of the optical fibers 21b to 2nb.

Each of the direct light-triggered thyristors 11 to 1n is a thyristor which is directly triggered by an optical signal. The direct light-triggered thyristors 11 to 1n are switched (driven) in accordance with optical gate signals L1 to Ln.

The optical fibers 21a to 2na and the optical fibers 21b to 2nb are cables which are used to perform communication with the optical gate signals. The optical fibers 21a to 2na are connected with gates of the direct light-triggered thyristors 11 to 1n. Each of the optical fibers 21b to 2nb is connected with the gate generator 4. The optical fiber 21a and the optical fiber 21b are the cables having the same diameter. Lengths of the optical fibers 21a to 2na may be short as long as portions connected with the optical fibers 21b to 2nb are pulled out from the structure.

The gate generator 4 is a device which generates the optical gate signals L1 to Ln that switch (trigger) the direct light-triggered thyristors 11 to 1n, respectively.

The relay portions 51 to 5n are components which connect the optical fibers 21a to 2na to the optical fibers 21b to 2nb, respectively. The relay portions 51 to 5n are configured to be readily attached to/detached from the optical fibers 21a to 2na and the optical fibers 21a to 2na.

The cooling fins 61 to 6n are heat sinks which radiate heat generated from the direct light-triggered thyristors 11 to 1n.

Figure 3:
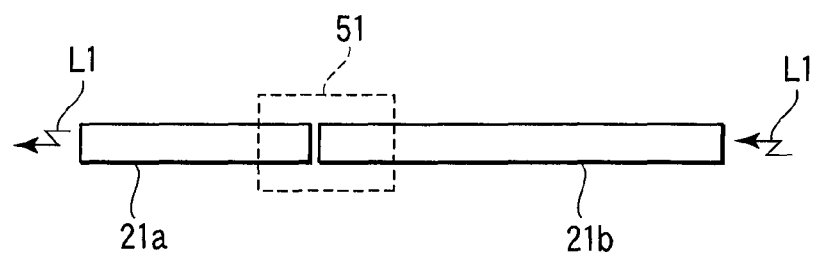
FIG. 3 is a block diagram showing a connected state of optical fibers of the semiconductor device according to the first embodiment of the present invention.

FIG. 3 is a block diagram showing a connected state of the optical fibers 21a and 21b in the semiconductor device 1 according to the first embodiment of the present invention. Here, the connected state of the optical fibers 21a and 21b is shown, but the other optical fibers have the same connected state.

The optical fiber 21a and the optical fiber 21b are connected with each other through the relay portion 51. When performing operations, e.g., manufacturing, assembling, or disassembling the semiconductor device 1, the optical fiber 21a or the optical fiber 21b is detached from the relay portion 51. As a result, the length of the optical fiber connected to the structure can be reduced, thereby facilitating handling the structure.

According to this embodiment, providing the relay portions 51 to 5n enables reducing the lengths of the optical fibers 21a to 2na connected with the direct light-triggered thyristors 11 to 1n. As a result, handling the optical fibers 21a to 2na pulled out from the structure becomes easy, thereby facilitating operations, e.g., manufacturing, assembling, or disassembling the semiconductor device 1. For example, in an operation of bonding the direct light-triggered thyristors 11 to 1n to the cooling fins 61 to 6n in particular, the structure can be readily handled. Further, decreasing the lengths of the optical fibers 21a to 2na enables reducing the possibility of damages to the optical fibers 21a to 2na as much as possible. When the optical fibers 21b to 2nb are damaged, they can be easily replaced without disassembling the semiconductor device 1.

Second Embodiment

Figure 4:
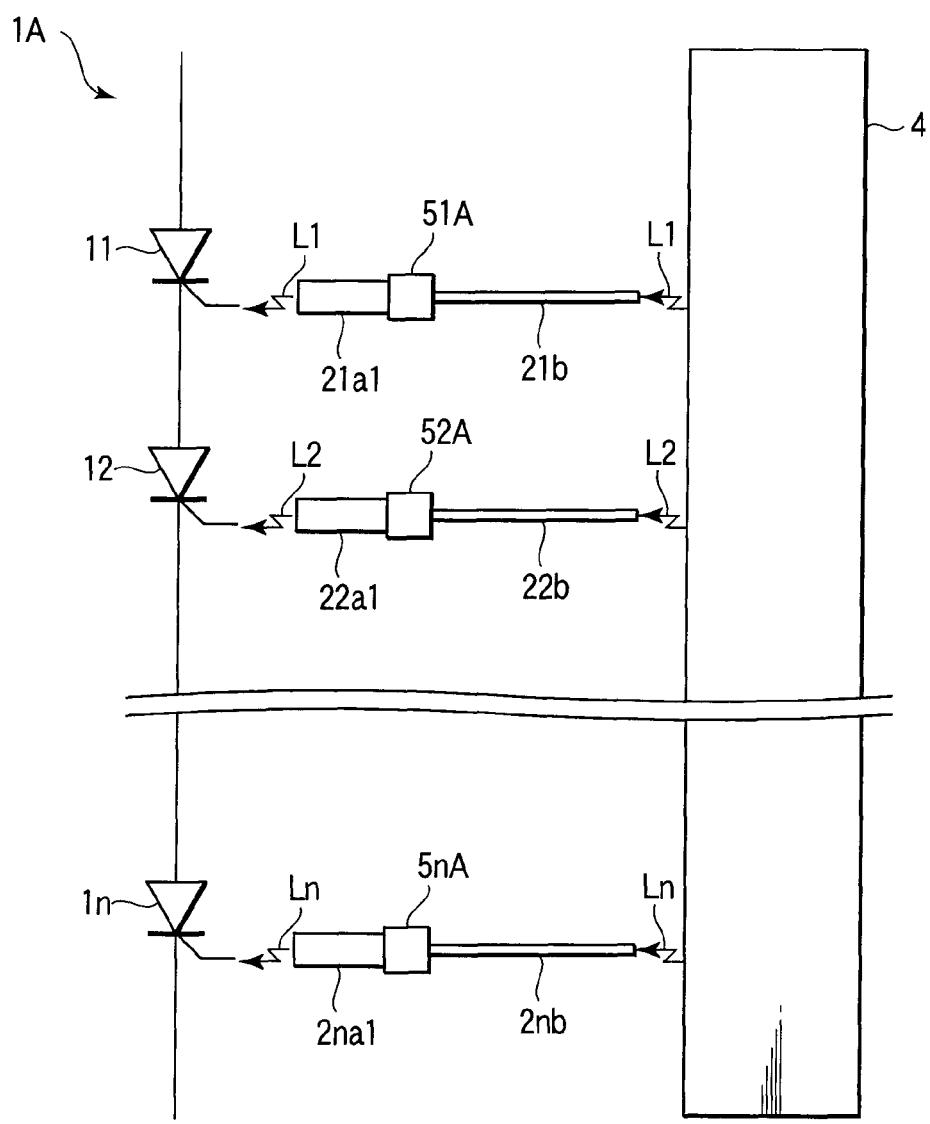
FIG. 4 is a block diagram showing a configuration of a semiconductor device according to a second embodiment of the present invention.

FIG. 4 is a block diagram showing a configuration of a semiconductor device 1A according to a second embodiment of the present invention.

The semiconductor device 1A is a modification of the semiconductor device 1 according to the first embodiment, and it has the same configuration except that the relay portions 51 to 5n are substituted by relay portions 51A to 5nA and the optical fibers 21a to 2na are replaced by optical fibers 21a1 to 2na1.

The optical fibers 21a1 to 2na1 have larger diameters than those of optical fibers 21b to 2nb.

One end of each of the relay portions 51A to 5nA has a shape which is connected to each of the optical fibers 21a1 to 1na1, and the other end of the same has a shape which is connected to each of the optical fibers 21b to 2nb.

FIG. 5 is a block diagram showing a connected state of the optical fibers 21a1 and 21b in the semiconductor device 1A according to the second embodiment of the present invention. Here, the connected state of the optical fiber 21a1 and the optical fiber 21b is shown, but the other optical fibers have the same connected state.

The optical fiber 21a1 and the optical fiber 21b are connected to each other through the relay portion 51A. When performing operations, e.g., manufacturing, assembling, or disassembling the semiconductor device 1, the optical fiber 21a1 or the optical fiber 21b is detached from the relay portion 51A. As a result, the length of the optical fiber connected to the structure can be reduced, thereby facilitating handling the structure.

According to this embodiment, in addition to the functions and effects of the first embodiment, the following functions and effects can be obtained.

To drive a direct light-triggered thyristor 11, not only simple transmission of signals "0" and "1" but also transmission of optical power for driving is required. Therefore, suppressing attenuation of the optical power of an optical gate signal L1 on bonded surfaces of the optical fiber 21a1 and the optical fiber 21b is important. Thus, diameters of the optical fibers 21a1 to 21n1 are increased to be larger than those of the optical fibers 21b to 2nb. Therefore, the bonded surface of the optical fiber 21a1 is larger than the bonded surface of the optical fiber 21b. Accordingly, even if the optical gate signal L1 output from the optical fiber 21b spreads in the relay portion 51A, the attenuation of the optical gate signal L1 (the optical power) transmitted to the optical fiber 21a1 can be suppressed. The same configuration can suppress the attenuation of each of optical gate signals L1 to Ln.

It is to be noted that the semiconductor device which constitutes a circuit corresponding to one phase has been described in each of the foregoing embodiments, but the present invention is not restricted thereto. A semiconductor device (a power conversion apparatus) which constitutes a circuit corresponding to three phases may be adopted, or a semiconductor device other than the power conversion apparatus may be used. Configurations of these devices can obtain the same functions and effects as those in each of the foregoing embodiments when the same configuration as that of each embodiment is adopted.

It is to be noted that the present invention is not restricted to the foregoing embodiments, and constituent elements can be modified and changed into shapes without departing from the scope of the invention at an embodying stage. Additionally, various inventions can be formed by appropriately combining a plurality of constituent elements disclosed in the foregoing embodiments. For example, several constituent elements may be eliminated from all constituent elements disclosed in the embodiments. Further, constituent elements in the different embodiments may be appropriately combined.

What is claimed is:

1. A semiconductor device comprising:
   a structure;
   a direct light-triggered thyristor enclosed inside the structure, the direct light-triggered thyristor being triggered by an optical gate signal;
   a first flexible light-conducting member which:
     has a first end connected to the direct light-triggered thyristor;
     has a second end extending out of the structure; and
     transmits the optical gate signal to the direct light-triggered thyristor;
   a second flexible light-conducting member located outside the structure; and
   a relaying unit located outside the structure and configured to:
     connect the second end of the first light-conducting member to the second light-conducting member; and
     transmit the optical gate signal from the second light-conducting member to the first light-conducting member;
   the first light-conducting member comprising an intermediate portion outside of the structure and of the relaying unit.

2. The device according to claim 1, further comprising:
a radiating unit configured to radiate heat generated from the direct light-triggered thyristor.

3. The device according to claim 1, wherein the first light-conducting member has a diameter larger than that of the second light-conducting member.

4. The device according to claim 1, further comprising:
an optical gate signal generating unit connected with the second light-conducting member and configured to generate the optical gate signal.

5. A semiconductor device comprising:
a structure;
a plurality of direct light-triggered thyristors enclosed inside the structure, the plurality of direct light-triggered thyristors being connected in series and triggered by optical gate signals;
a plurality of first flexible light-conducting members which:
  have first ends connected with the plurality of direct light-triggered thyristors;
  have second ends extending out of the structure; and
  transmit the plurality of optical gate signals to the direct light-triggered thyristors, respectively;
a plurality of second flexible light-conducting members located outside the structure; and
a plurality of relaying units located outside the structure and configured to:
  connect the second ends of the plurality of first light-conducting members to the plurality of second light-conducting members; and
  transmit the plurality of optical gate signals output from the plurality of second light-conducting members to the plurality of first light-conducting members, respectively;
the first light-conducting members comprising intermediate portions outside of the structure and of the relaying units.

6. The device according to claim 5, further comprising:
a plurality of radiating units configured to radiate heat generated from the plurality of direct light-triggered thyristors, respectively.

7. The device according to claim 5, wherein the plurality of first light-conducting members have diameters larger than those of the plurality of second light-conducting members, respectively.

8. The device according to claim 5, further comprising:
an optical gate signal generating unit connected to the plurality of second light-conducting members and configured to generate the plurality of optical gate signals, respectively.

* * * * *